United States Patent [19]

Murata et al.

[11] Patent Number: 5,180,983

[45] Date of Patent: Jan. 19, 1993

[54] IGNITION PLUG FOR AN INTERNAL COMBUSTION ENGINE PROVIDED WITH AN IONIZATION CURRENT DETECTOR ELECTRODE

[75] Inventors: Shigemi Murata; Masayuki Ikeuchi, both of Himeji, Japan

[73] Assignee: Mitsubishi Denki K.K., Tokyo, Japan

[21] Appl. No.: 764,744

[22] Filed: Sep. 24, 1991

[30] Foreign Application Priority Data

Sep. 27, 1990 [JP] Japan ................................. 2-255139
Oct. 2, 1990 [JP] Japan ................................. 2-263048
Oct. 11, 1990 [JP] Japan ................................. 2-270616
Oct. 12, 1990 [JP] Japan ................................. 2-272102
Oct. 12, 1990 [JP] Japan ................................. 2-272103
Oct. 12, 1990 [JP] Japan ................................. 2-272104

[51] Int. Cl.⁵ ..................... G01N 27/70; G01M 19/02; H01T 13/22
[52] U.S. Cl. ..................... 324/399; 324/402; 324/464; 313/141
[58] Field of Search ............... 324/378, 393, 399, 402, 324/459, 464; 313/140, 141

[56] References Cited

U.S. PATENT DOCUMENTS 5,087,882 2/1992 Iwata .......................... 324/464 X

FOREIGN PATENT DOCUMENTS 5123372 9/1980 Japan .
56-133641 10/1981 Japan .
1187558 8/1986 Japan .

Primary Examiner—Gerard R. Strecker
Assistant Examiner—Diep Do
Attorney, Agent, or Firm—Sughrue, Mion, Zinn, Macpeak & Seas

[57] ABSTRACT

An ignition plug for an internal combustion engine includes an ionization current detector electrode 20 adapted to be coupled to an external ionization detector circuit. Preferably, the ionization current detector electrode extends through a lateral through-hole formed vertically through an expanded portion of the electrical insulator 3. The lower end of the ionization current detector electrode may extend into the combustion chamber by a predetermined length. Further, the lower end of the ionization current detector electrode exposed to the fuel/air mixture within the combustion chamber may form a cylindrical grid to increase the contact area with the combustion gas.

10 Claims, 8 Drawing Sheets

SPREADING OF COMBUSTION

IGNITION PLUG FOR AN INTERNAL COMBUSTION ENGINE PROVIDED WITH AN IONIZATION CURRENT DETECTOR ELECTRODE

BACKGROUND OF THE INVENTION

This invention relates to ignition plugs for internal combustion engines, and more particularly to those provided with an ionization current detector electrode.

FIG. 1 shows a conventional ignition plug for an internal combustion engine capable of detecting the ionization current, and FIG. 2 shows the ignition circuit provided with a conventional ignition plug capable of detecting the ionization current.

The ignition plug 100 for an internal combustion engine includes a central electrode 1 and a grounded electrode 2 opposing the central electrode 1. The spark is generated across the central electrode 1 and the grounded electrode 2 to initiate combustion of the fuel-/air mixture within the cylinder of an internal combustion engine. The central electrode 1 is covered with an electrical insulator 3. The electrical insulator 3 is partially surrounded by a housing 4. The central electrode 1 is coupled to an electrically conductive terminal 5, which is coupled to an ignition coil 7 via a diode 6 for preventing reverse currents. Further, the terminal 5 is coupled to the negative electrode of a DC voltage source 10 via a diode 8 for preventing reverse currents and via a resistor 9. Further, the cathode of the diode 8 is grounded via a capacitor 11 and a resistor 12. The junction point between the capacitor 11 and the resistor 12 is coupled to an output terminal 13, via which an ionization current detection signal D is obtained.

As shown in FIG. 2, the secondary side of the ignition coil 7 is coupled to the collector of a power transistor 15, the emitter of which is grounded. The base of the power transistor 15 is coupled to an input terminal 16 to which a control signal from a fuel injection timing/ignition timing control unit (not shown) is input.

The operation of the above conventional ignition plug circuit for an internal combustion engine is as follows. A high negative voltage I is generated by the ignition coil 7, which is applied via the diode 6 to the central electrode 1 of the ignition plug 100. Thus, a spark is generated across the central electrode 1 and the grounded electrode 2 to ignite the fuel/air mixture within the cylinder of the engine. The resulting combustion induces ionization of the gas within the cylinder and an ionization current is thus detected at the output terminal 13 as the ionization current detection signal D.

The above conventional ignition plug circuit has the following disadvantage. First, since two diodes 6 and 8 are utilized for separating the ignition voltage I and the detection signal D, the production cost is increased. Further, since a single cable 14 utilized for the ignition voltage I and the detection signal D constitutes a common impedance for both, the noise generated at the ignition makes the detection of the ionization current difficult.

SUMMARY OF THE INVENTION

It is therefore an object of this invention to provide an inexpensive ignition plug for an internal combustion engine which is capable of detecting the ionization current without adverse effects of noise generated at the ignition.

The above object is accomplished in accordance with the principle of this invention by an ignition plug which includes: a housing; a cylindrical electrical insulator centrally extending through said housing; a central electrode centrally extending through said electrical insulator, said central electrode having an end exposed within a combustion chamber of the internal combustion engine and another end adapted to be electrically connected to an ignition coil; a grounded electrode opposing the central electrode across a predetermined gap, to generate a spark therebetween to ignite a fuel-/air mixture within the combustion chamber of the internal combustion engine; and an ionization current detector electrode having an end exposed to the fuel/air mixture within the combustion chamber and another end adapted to be connected to an ionization current detector circuit. Preferably, the housing is made of a metal and grounded electrode is integrally secured to said housing. Further, the electrical insulator has a lower expanded portion and the housing surrounds said lower expanded portion of the electrical insulator.

It is further preferred that the ionization current detector electrode extends through a lateral through-hole formed through said electrical insulator to extend vertically therethrough. More specifically, it is preferred that the ionization current detector electrode extends through a lateral through-hole formed through said lower expanded portion of the electrical insulator to extend vertically therethrough.

Still preferably, the ionization current detector electrode is disposed at a side opposite to the central electrode with respect to the grounded electrode. Further, the end of the ionization current detector electrode exposed to the fuel/air mixture within the combustion chamber preferably extends into the combustion chamber by a predetermined length.

It is further preferred that the ignition plug includes a connector integrally secured to said electrical insulator for electrically connecting said ionization current detector electrode to an external ionization current detector circuit.

Still preferably, the ionization current detector electrode includes a grid-shaped lower end portion exposed to the fuel/air mixture within the combustion chamber. It is preferred that the grid-shaped portion forms a hollow cylinder.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
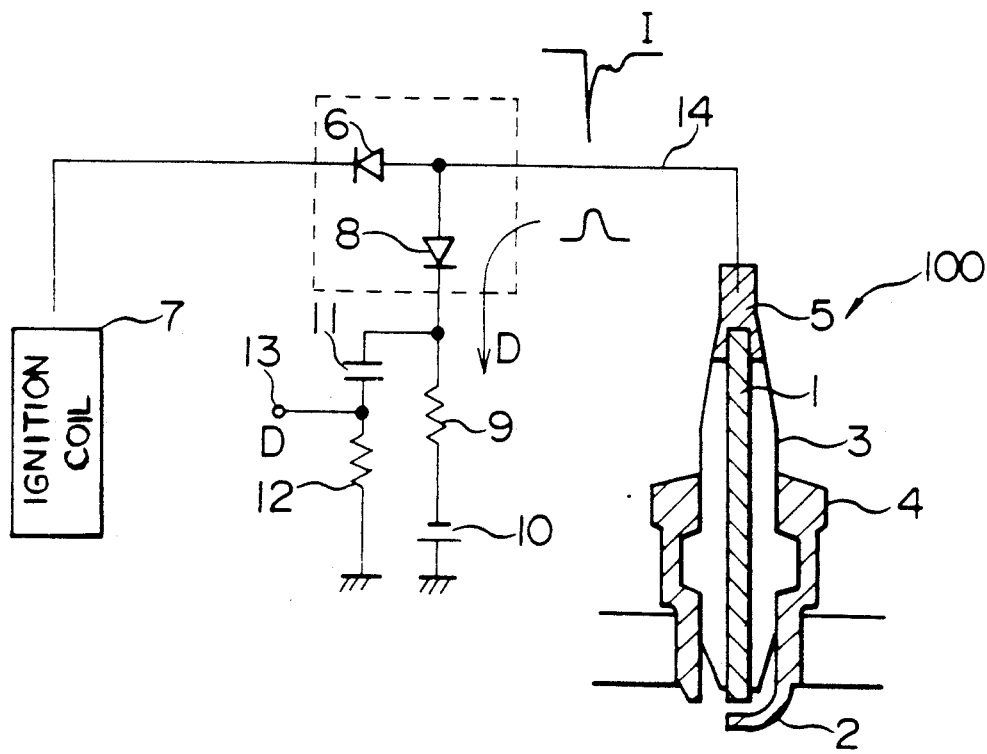
FIG. 1 shows a conventional ignition plug for an internal combustion engine capable of detecting the ionization current.
Figure 2:
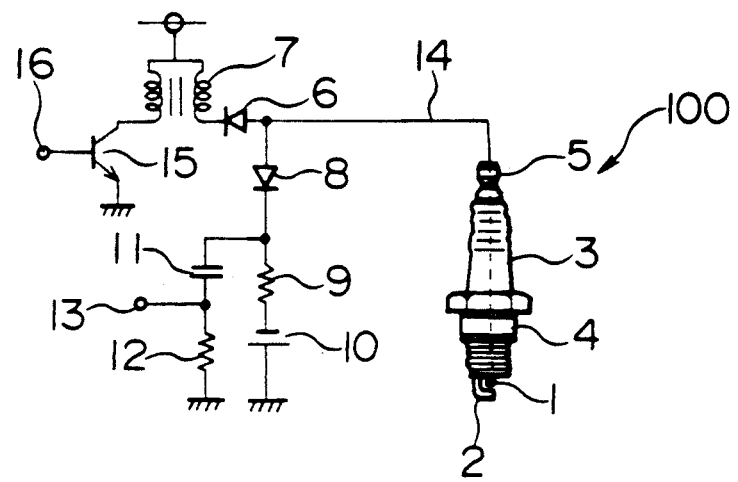
FIG. 2 shows the ignition circuit provided with a conventional ignition plug capable of detecting the ionization current.
Figure 3:
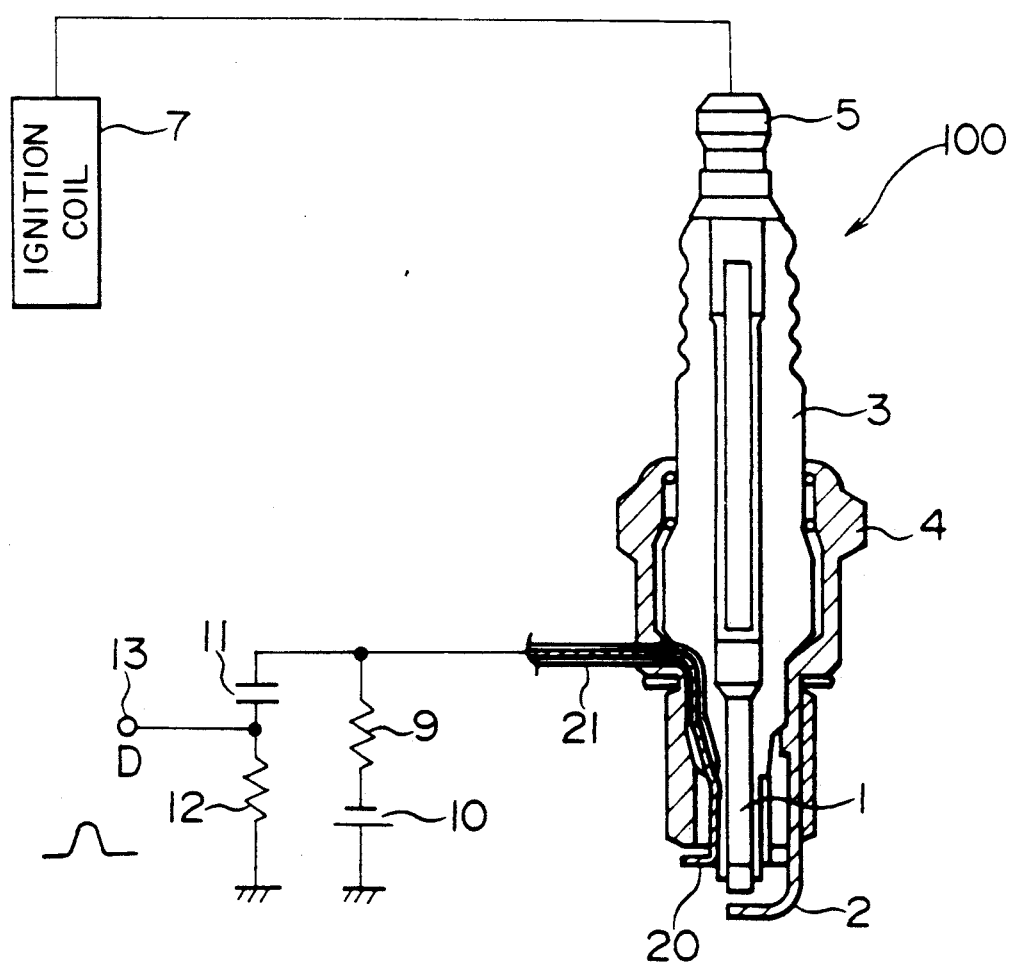
FIG. 3 shows an ignition plug for an internal combustion engine according to a first embodiment of this invention.

FIG. 3 shows an ignition plug for an internal combustion engine according to a first embodiment of this invention, where the parts 1 through 5, the part 7, and the parts 9 through 13 are the same as those of the conventional ignition plug described above. The housing 4 is made of an electrically conductive material (i.e., a metal) and grounded electrode 2 is integrally secured to the housing 4. In addition thereto, an ionization current detector electrode 20 having the lower end partially projecting into the cylinder of the internal combustion engine is provided. The outer terminal of the ionization current detector electrode 20 is coupled to the resistor 9 and the capacitor 11 via a lead 21.

The operation of the embodiment of FIG. 3 is as follows. A high negative voltage generated by the ignition coil 7 in synchrony with the rotation of the internal combustion engine is supplied directly to the central electrode 1, such that an arc discharge is generated across the central electrode 1 and the grounded electrode 2 to ignite the fuel/air mixture within the cylinder of the internal combustion engine.

The combustion of the fuel/air mixture induces ionization thereof. Thus, due to a negative voltage developed by the DC voltage source 10 across the ionization current detector electrode 20 and the ground, an ionization current flows across the ionization current detector electrode 20 and the grounded electrode 2 and through the resistor 9. Further, since the capacitor 11 is charged by the DC voltage source 10 before the ignition, a part of the ionization current flows via the resistor 12. The ionization current is thus detected at the output terminal 13 as a voltage across the resistor 12.

Figure 4:
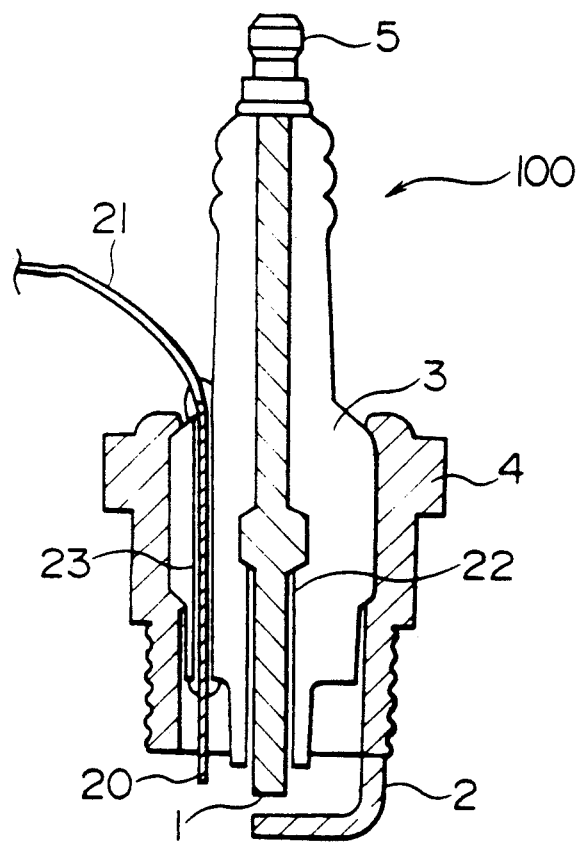
FIG. 4 shows an ignition plug for an internal combustion engine according to a second embodiment of this invention.
Figure 5:
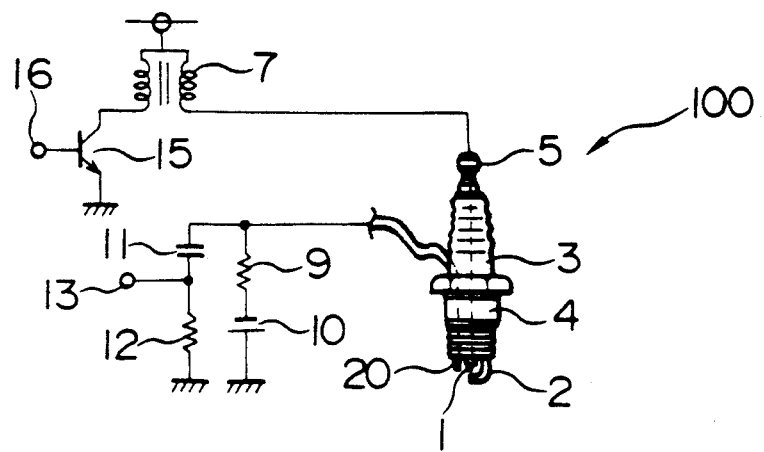
FIG. 5 shows the ignition circuit for the ignition plug of FIG. 4.

FIG. 4 shows an ignition plug for an internal combustion engine according to a second embodiment of this invention, and FIG. 5 shows the ignition circuit for the ignition plug of FIG. 4, where the parts 1 through 5, 7, 9 through 13, and 15 and 16 are the same as those of the conventional ignition plug described above. In addition thereto, an ionization current detector electrode 20 having the lower end partially projecting into the cylinder of the internal combustion engine is provided. The outer terminal of the ionization current detector electrode 20 is coupled to the resistor 9 and the capacitor 11 via a lead 21. The ionization current detector electrode 20 is disposed to the same side as the central electrode 1 with respect to the grounded electrode 2. That is, the grounded electrode 2 and the ionization current detector electrode 20 are at opposite sides of the central electrode 1. The central electrode 1 extends through a central through-hole 22 formed through the electrical insulator 3. As described thus far, the second embodiment is similar to that of FIG. 3. The second embodiment of FIGS. 4 and 5 is characterized by the fact that the electrical insulator 3 has a lower expanded portion surrounded by the housing 4 and that the ionization current detector electrode 20 extends through a lateral through-hole 23 extending vertically through the side wall of the lower expanded portion of the electrical insulator 3. Thus, it suffices to insert the ionization current detector electrode 20 through the lateral through-hole 23 of the electrical insulator 3 in order to connect the ionization current detector electrode 20 to the outer ionization current detection circuit. This mounting structure of the ionization current detector electrode 20 is simple and inexpensive.

Figure 6:
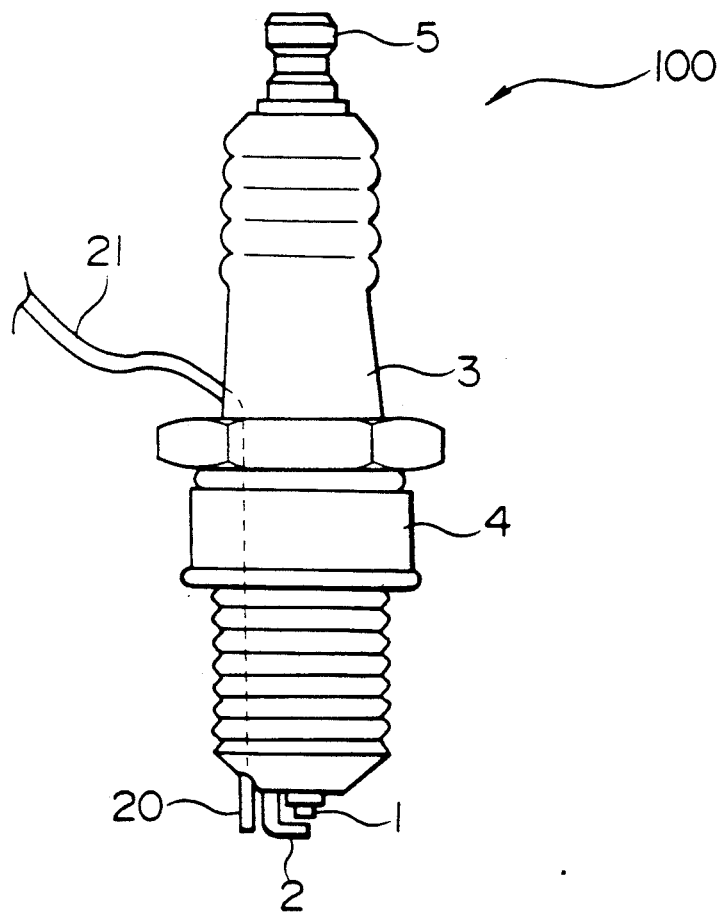
FIG. 6 shows an ignition plug for an internal combustion engine according to a third embodiment of this invention.
Figure 7:
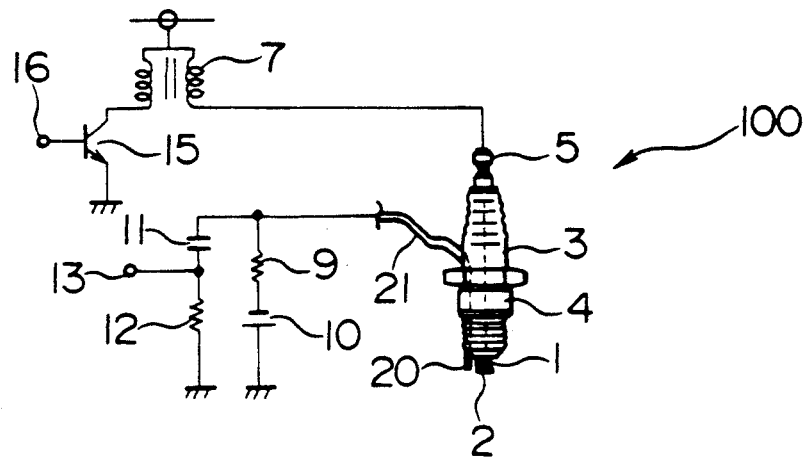
FIG. 7 shows the ignition circuit for the ignition plug of FIG. 6.

FIG. 6 shows an ignition plug for an internal combustion engine according to a third embodiment of this invention, and FIG. 7 shows the ignition circuit for the ignition plug of FIG. 6. The third embodiment of FIGS. 6 and 7 is similar to the first or the second embodiment described above, wherein the same reference numerals represent the same or corresponding parts. However, according to the third embodiment, the ionization current detector electrode 20 is disposed at a side opposite to the central electrode 1 with respect to the grounded electrode 2. Namely, the ionization current detector electrode 20 is at the back or radially outer side of the grounded electrode 2. Thus, the effects of the high voltage discharge across the central electrode 1 and the grounded electrode 2 does not reach the ionization current detector electrode 20 and the adverse effects thereof is minimized. Namely, there is no danger that a discharge is generated across the central electrode 1 and the ionization current detector electrode 20 and that the resulting high voltage destroys the ionization current detector circuit directly coupled to the ionization current detector electrode 20.

Figure 8:
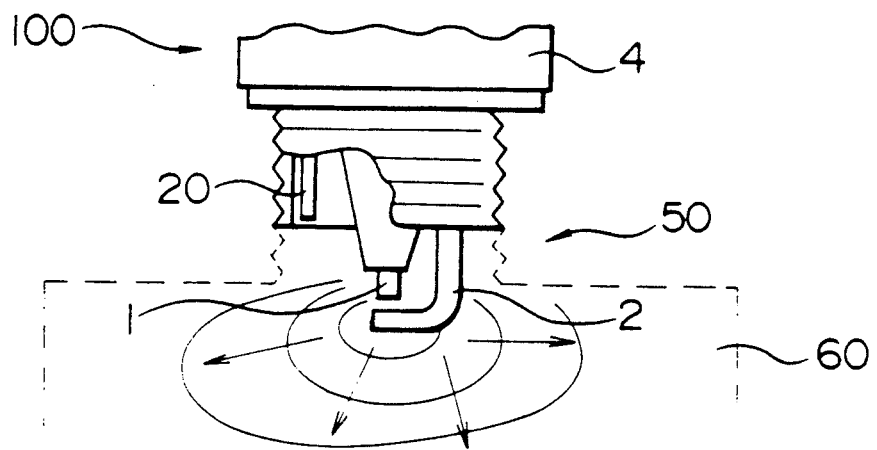
FIG. 8 shows the details of the lower end portion of a typical ignition plug provided with an ionization current detector electrode.

FIG. 8 shows the details of the lower end portion of a typical ignition plug provided with an ionization current detector electrode. On the other hand, FIG. 9 shows the details of the lower end portion of an ignition plug provided with an ionization current detector electrode according to a fourth embodiment of this invention.

As shown in FIG. 8, the lower end of the ionization current detector electrode 20 is typically at the same level as the bottom end of the housing 4 or a little bit at a higher level, for the purpose of not disturbing the spreading of the combustion gas flow within the combustion chamber 60 of the internal combustion engine 50. This geometry of the ionization current detector electrode 20, however, has the disadvantage that the detection sensitivity is low since the end of the ionization current detector electrode 20 does not reach the combustion gas flow which generates ions within the combustion chamber 60 of the cylinder of the internal combustion engine 50.

Figure 9:
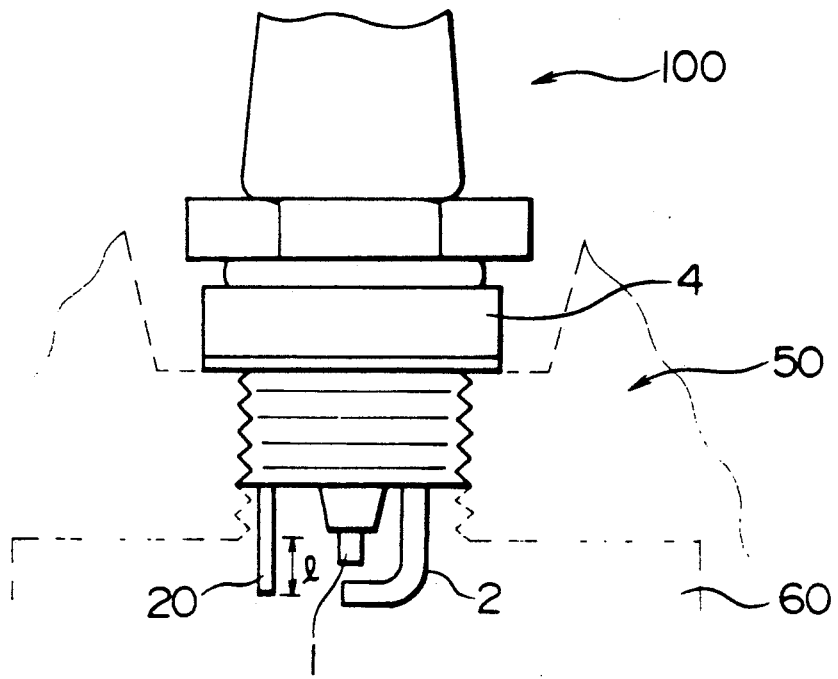
FIG. 9 shows the details of the lower end portion of an ignition plug provided with an ionization current detector electrode according to a fourth embodiment of this invention.

Thus, as shown in FIG. 9, according to the fourth embodiment of this invention, the lower end of the ionization current detector electrode 20 projects from below the bottom end of the housing 4 into the combustion chamber 60 by a predetermined length 1, such that the end of the ionization current detector electrode 20 reaches the combustion gas flow that generates ions. Thus, the detection sensitivity of the ionization current via the ionization current detector electrode 20 is enhanced. The exact value of this projection length 1 of the ionization current detector electrode 20 into the combustion chamber 60 is best determined experimentally for each geometry of the combustion chamber 60 and the central electrode 1 and the grounded electrode 2.

Figure 10:
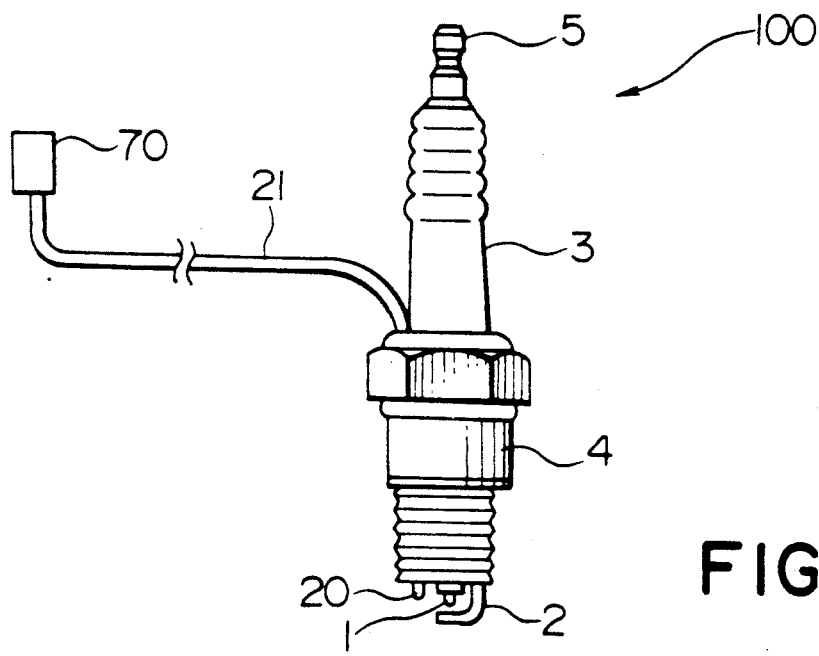
FIG. 10 shows the external lead arrangement of a typical ignition plug provided with an ionization current detector electrode.
Figure 11:
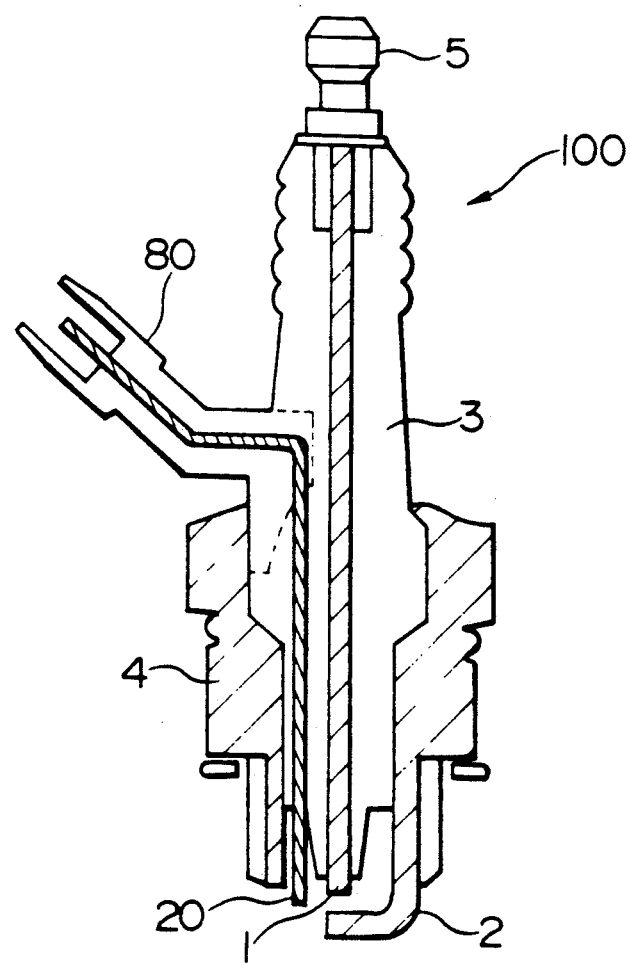
FIG. 11 shows the external lead arrangement of an ignition plug provided with an ionization current detector electrode according to a fifth embodiment of this invention.

FIG. 10 shows the external lead arrangement of a typical ignition plug provided with an ionization current detector electrode, while FIG. 11 shows the external lead arrangement of an ignition plug provided with an ionization current detector electrode according to a fifth embodiment of this invention.

In the case of a typical ignition plug provided with a ionization current detector electrode 20 shown in FIG. 10, the ionization current detector electrode 20 is connected to the ionization current detector circuit via a lead 21 coupled to the ionization current detector electrode 20 and further via a socket 70 coupled to the lead 21. This arrangement, however, has the disadvantage that the mounting of the ignition plug 100 to the internal combustion engine is made difficult by the lead 21 projecting from the ignition plug 100. Further, different lengths of the lead 21 required for different types of internal combustion engines reduces the production efficiency. As a result, the production cost of the ignition plugs increases.

Thus, according to the fifth embodiment of this invention shown in FIG. 11, a connector 80 for connecting the ionization current detector electrode 20 to the external ionization current detector circuit is secured to the electrical insulator 3, such that the connector 80 is integral with the electrical insulator 3. Thus, the lead 21 of FIG. 10 extending from the ignition plug 100 can be dispensed with. The connector 80 is made of an electrically insulating material and the ionization current detector electrode 20 centrally extends therethrough. As a result, the production efficiency is improved and the production cost is reduced.

Figure 12:
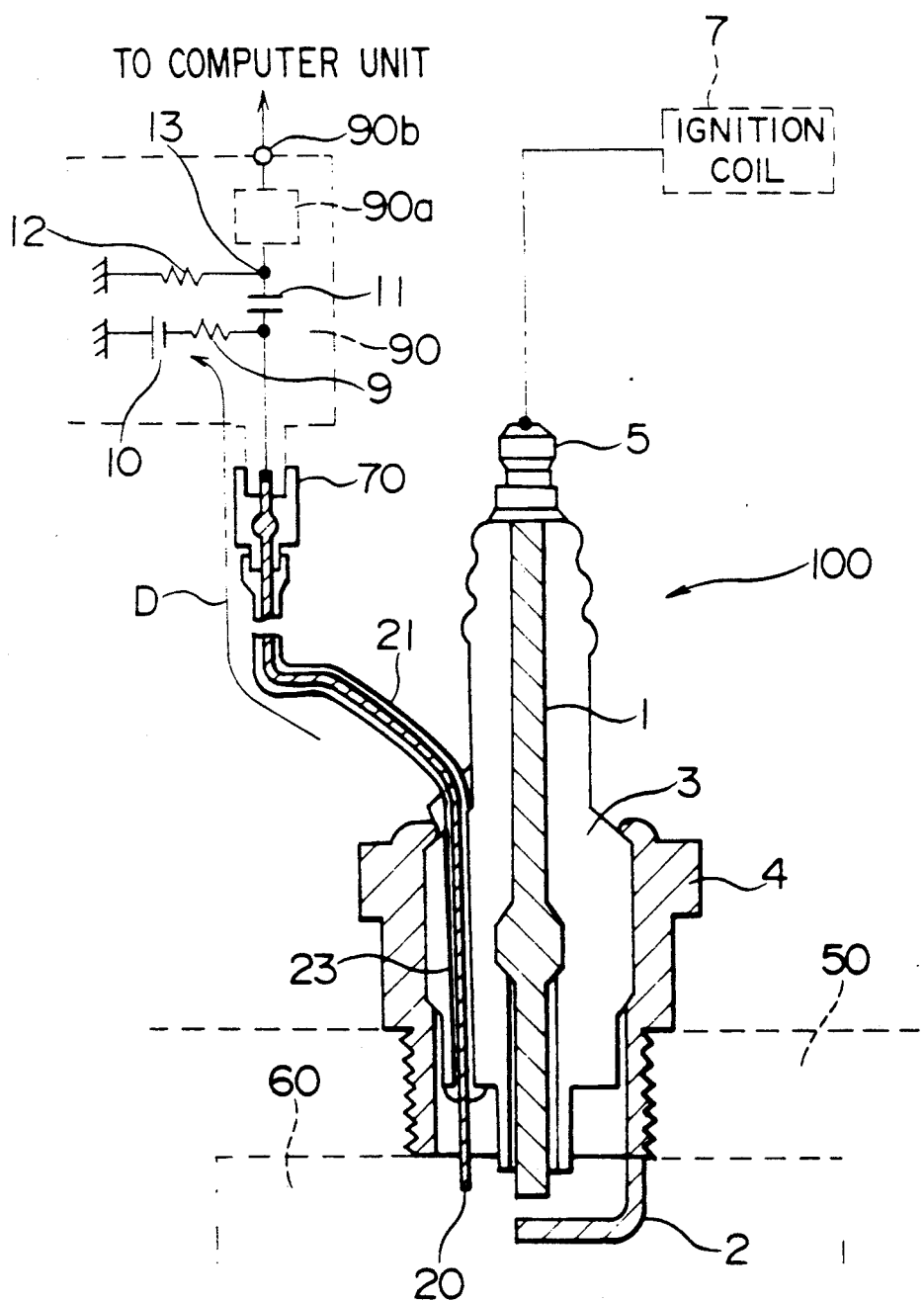
FIG. 12 shows the typical form of the ionization current detector electrode of the ignition plug together with the associated circuit.
Figure 13:
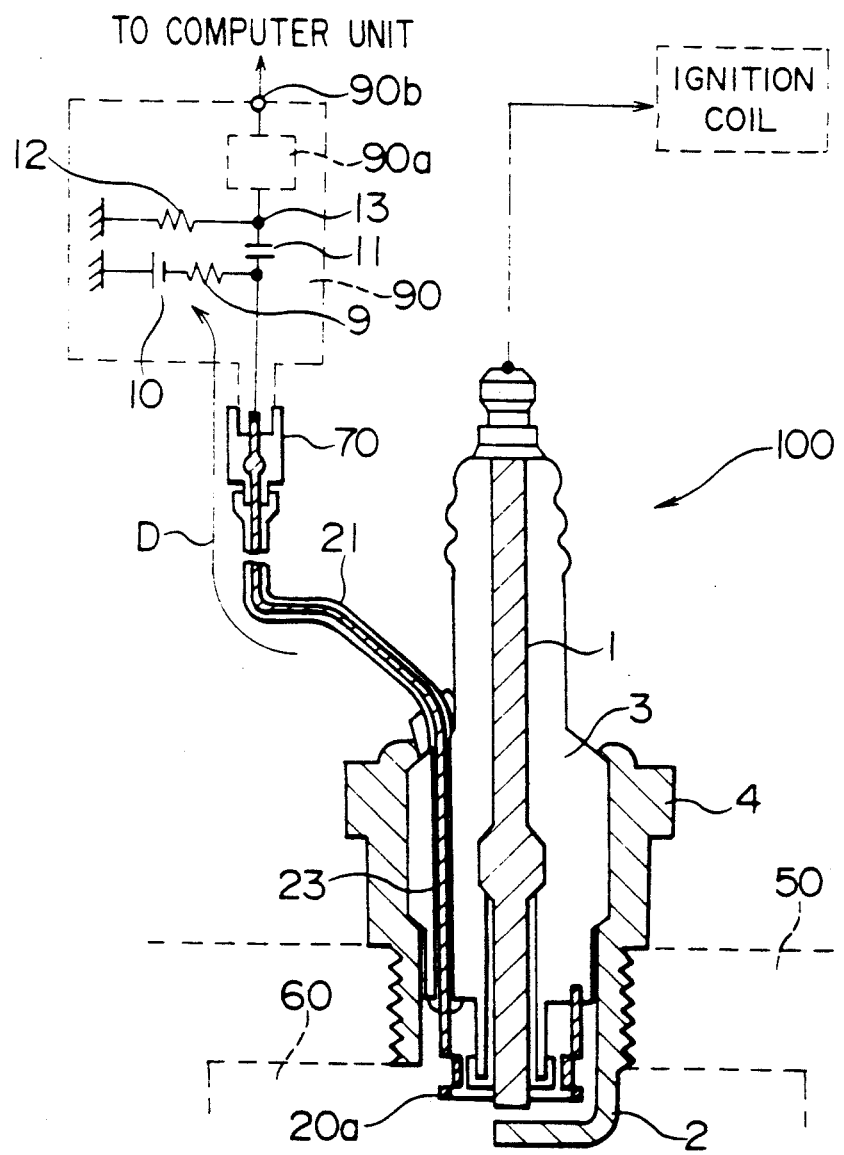
FIG. 13 shows the section of an ignition plug according to a sixth embodiment of this embodiment.

FIG. 12 shows the typical form of the ionization current detector electrode of the ignition plug together with the associated circuit. FIG. 13 shows the section of an ignition plug according to a sixth embodiment of this embodiment, and FIG. 14 is a perspective view of the lower cylindrical portion of the ionization current detector electrode of the ignition plug of FIG. 13.

In FIG. 12, the ionization current detector electrode 20 is coupled via the lead 21 and the socket 70 to the negative voltage source circuit 90. The negative voltage source circuit 90 includes the resistor 9, the DC voltage source 10, the capacitor 11, and the resistor 12, all of which correspond to those represented in other figures. The output terminal 13 is coupled to an ionization current detector unit 90a. The output terminal 90b of the ionization current detector unit 90a is coupled to a computer unit, etc.

In the case of a typical ignition plug shown in FIG. 12, the rod-shaped lower end portion of the ionization current detector electrode 20 simply extends into the combustion chamber 60 of the internal combustion engine 50. Thus, the ignition plug of FIG. 12 has the disadvantage that the surface area of the ionization current detector electrode 20 exposed within the combustion chamber 60 is small. Since the area of the ionization current detector electrode 20 in contact with the combustion gas is small, the detection sensitivity is low.

Figure 14:
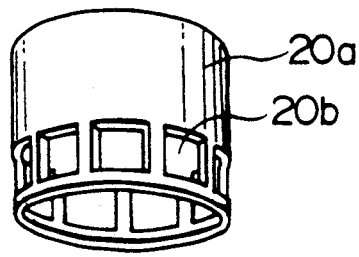
FIG. 14 is a perspective view of the lower cylindrical portion of the ionization current detector electrode of the ignition plug of FIG. 13.

Thus, according to a sixth embodiment of FIGS. 13 and 14, the ionization current detector electrode 20 has a hollow cylindrical lower end portion 20a. The portion of the hollow cylindrical lower end portion 20a that projects into the combustion chamber 60 has a plurality of windows 20b over the whole circumference, such that the lower end portion of the hollow cylindrical lower end portion 20a exposed to the fuel/air mixture within the combustion chamber 60 forms a hollow cylindrical grid. Thus, the resistance of the hollow cylindrical lower end portion 20a with respect to the combustion gas flow is minimized and the combustion output power of the internal combustion engine is maintained. Since the contact area of the hollow cylindrical lower end portion 20a with the combustion gas is large, the detection sensitivity of the ionization current detector electrode 20 is enhanced.

The form of the lower end portion of the ionization current detector electrode 20 may be other than that of a hollow cylinder. Provided that the contact area is large, an ionization current detector electrode 20 having a flat bottom is equally effective in enhancing the detection sensitivity.

In the case of the above embodiments, a single ionization current detector electrode is provided. However, the ignition plug may be provided with a plurality of ionization current detector electrodes.

What is claimed is:

1. An ignition plug for an internal combustion engine, comprising:
   a housing;
   a cylindrical electrical insulator centrally extending through said housing;
   a central electrode coupled to and centrally extending through said electrical insulator, said central electrode having a first end exposed within a combustion chamber of the internal combustion engine and a second, opposite end adapted to be electrically connected to an ignition coil through a first dedicated connection line;
   a grounded electrode opposing the central electrode across a predetermined gap, to generate a spark therebetween to ignite a fuel/air mixture within the combustion chamber of the internal combustion engine; and
   an ionization current detector electrode coupled to said electrical insulator, and having a first end exposed to the fuel/air mixture within the combustion chamber and a second end adapted to be connected to an ionization current detector circuit through a second dedicated connection line, said second dedicated connection line being separate and distinct from said first dedicated connection line to prevent noise generated at ignition from affecting detection of ionization current by said ionization current detector circuit.

2. An ignition plug as claimed in claim 1, wherein said housing comprises a metal and said grounded electrode is integrally secured to said housing.

3. An ignition plug as claimed in claim 2, wherein said electrical insulator has a lower expanded portion and said housing surrounds said lower expanded portion of the electrical insulator.

4. An ignition plug as claimed in claim 1, wherein said ionization current detector electrode extends through a lateral through-hole formed through said electrical insulator to extend vertically therethrough.

5. An ignition plug as claimed in claim 3, wherein said ionization current detector electrode extends through a lateral through-hole formed through said lower expanded portion of the electrical insulator to extend vertically therethrough.

6. An ignition plug as claimed in claim 1, wherein said ionization current detector electrode is disposed at a side opposite to the central electrode with respect to the grounded electrode.

7. An ignition plug as claimed in claim 1, wherein said first end of the ionization current detector electrode exposed to the fuel/air mixture within the combustion chamber extends into the combustion chamber by a predetermined length.

8. An ignition plug as claimed in claim 1, further comprising a connector integrally secured to said electrical insulator for electrically connecting said ionization current detector electrode to an external ionization current detector circuit.

9. An ignition plug as claimed in claim 1, wherein said ionization current detector electrode includes a grid-shaped lower end portion exposed to the fuel/air mixture within the combustion chamber.

10. An ignition plug as claimed in claim 9, wherein said grid-shaped portion forms a hollow cylinder.

* * * * *